United States Patent
Tang et al.

(10) Patent No.: US 7,764,477 B2
(45) Date of Patent: Jul. 27, 2010

(54) ELECTROSTATIC DISCHARGE PROTECTION CIRCUIT INCLUDING OVONIC THRESHOLD SWITCHES

(75) Inventors: Stephen H. Tang, Fremont, CA (US); Derchang Kau, Cupertino, CA (US); Charles C. Kuo, Union City, CA (US)

(73) Assignee: Ovonyx, Inc., Rochester Hills, MI (US)

( * ) Notice: Subject to any disclaimer, the term of this patent is extended or adjusted under 35 U.S.C. 154(b) by 0 days.

(21) Appl. No.: 12/080,081

(22) Filed: Mar. 31, 2008

(65) Prior Publication Data
US 2009/0244796 A1 Oct. 1, 2009

(51) Int. Cl.
| *H02H 9/00* | (2006.01) |
| *H01C 7/12* | (2006.01) |
| *H02H 1/00* | (2006.01) |
| *H02H 1/04* | (2006.01) |
| *H02H 3/22* | (2006.01) |
| *H02H 9/06* | (2006.01) |

(52) U.S. Cl. .......................... 361/56; 361/118
(58) Field of Classification Search .................. 361/56
See application file for complete search history.

(56) References Cited

U.S. PATENT DOCUMENTS

| 4,809,044 | A  | * | 2/1989  | Pryor et al. ..................... 257/3 |
| 6,275,089 | B1 | * | 8/2001  | Song et al. ................... 327/314 |
| 6,483,365 | B2 | * | 11/2002 | Morishita ..................... 327/314 |
| 7,164,565 | B2 | * | 1/2007  | Takeda .......................... 361/56 |
| 2008/0067486 | A1 | * | 3/2008 | Karpov et al. .................. 257/3 |

OTHER PUBLICATIONS

Adler et al., "Threshold switching in chalcogenide-glass thin films," J. Appl. Phys., vol. 51, No. 6, pp. 3289-3309, 1980.

* cited by examiner

*Primary Examiner*—Jared J Fureman
*Assistant Examiner*—Dharti H Patel
(74) *Attorney, Agent, or Firm*—Trop, Pruner & Hu, P.C.

(57) ABSTRACT

An electrostatic discharge protection circuit may include ovonic threshold switches that have a holding voltage greater than an input voltage normally received from a pad. As a result, the ovonic threshold switches provide a low resistance state to shunt current from the pad when an electrostatic discharge protection event occurs and, otherwise, present an off device during normal circuit operations.

23 Claims, 4 Drawing Sheets

ELECTROSTATIC DISCHARGE PROTECTION CIRCUIT INCLUDING OVONIC THRESHOLD SWITCHES

BACKGROUND

This relates to electrostatic discharge protection and, particularly, to circuits for handling electrostatic discharges related to integrated circuits.

An electrostatic discharge may occur as a result of buildup of static electricity. For example, a person walking on a wool rug on a dry winter day can generate a charge of tens of thousands of volts. Although such electrostatic discharges usually involve a relatively minor flow of current, they are sufficient to destroy some microelectronic circuits.

For example, complementary metal oxide semiconductor integrated circuits are sensitive to static electricity, particularly before being inserted into a larger circuit on a printed circuit board. Furthermore, the complementary metal oxide semiconductor circuits themselves are typically unable to handle any significant power, so it is difficult and expensive to arrange on-chip protection by dedicating certain portions of the chip to electrostatic discharge protection.

DETAILED DESCRIPTION

Figure 1:
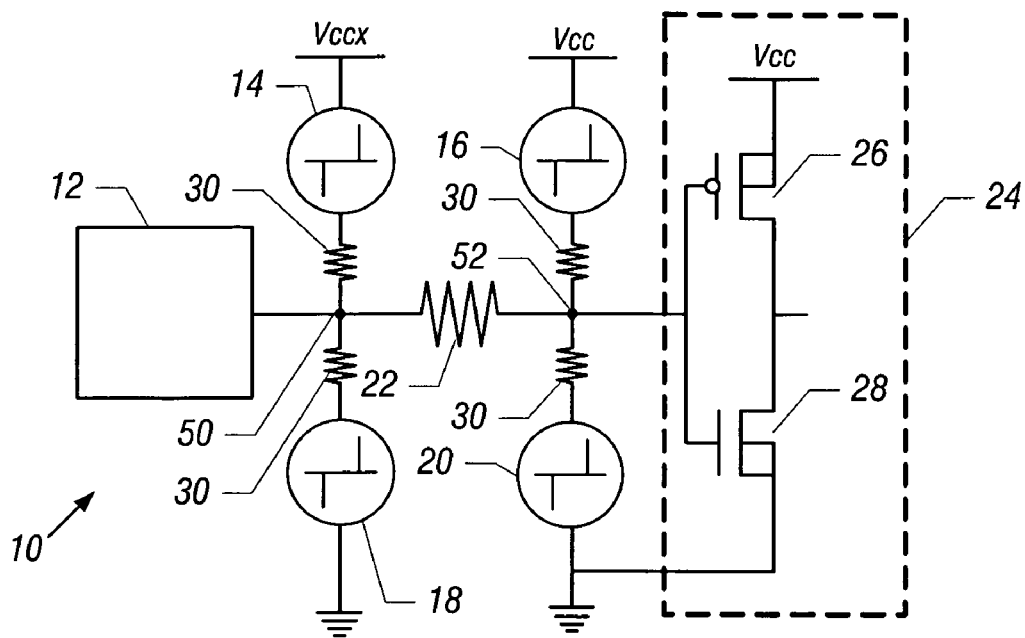
FIG. 1 is a schematic depiction of one embodiment of the present invention.

Referring to FIG. 1, the circuit 10 is an electrostatic discharge protection circuit for a circuit, such as a complementary metal oxide semiconductor circuit, connected, for example, through the input buffer 24. The input buffer 24 is also a complementary metal oxide semiconductor circuit in the form of an inverter including a PMOS device 26 and an NMOS device 28. The entire circuit, including the electrostatic protection circuit 10 and the circuit connected to the input buffer 24, may all be integrated on a single integrated circuit.

A low voltage input pad 12 may be provided for input signals to the circuit connected to the buffer 24. However, in other embodiments, the pad may be a power supply pad, an open drain pad, an output pad, a cross domain/power, or a multi-chip packaging pad.

The pad 12 is coupled to a circuit that includes an ovonic threshold switch 14, coupled between a supply voltage $V_{CCX}$ and an intermediate node 50 through a resistor 30. Another ovonic threshold switch 18 is coupled to ground and to the same intermediate node 50 through another resistor 30. The resistors 30 may be ballasting resistors used to prevent the ovonic threshold switch from destroying itself if the dissipated power is too high. The intermediate node also includes a resistor 22, coupling another pair of ovonic threshold switches 16 and 20. The switch 16 is coupled to $V_{CC}$ on one side and to the intermediate node 52 through a resistor 30. Likewise, the ovonic threshold switch 20 is coupled between ground and the intermediate node 52 by a resistor 30.

In one embodiment, all the ovonic threshold switches are identical. The input buffer 24 connects to ground below the ovonic threshold switch 20. The intermediate node also is coupled to the input buffer 24.

The input buffer 24 operates using a supply voltage of $V_{CC}$, generally available on the integrated circuit. Although $V_{CCX}$ may be different than $V_{CC}$, generally, it may be the same as the supply voltage.

Figure 2:
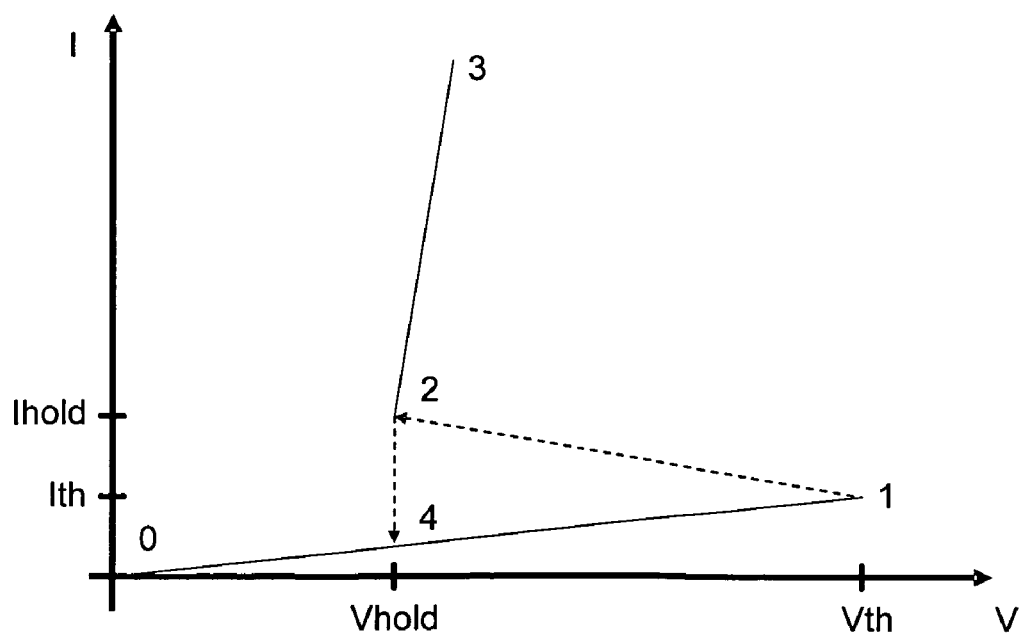
FIG. 2 is a plot of current versus voltage for an ovonic threshold switch.

An ovonic threshold switch is either on or off depending on the amount of voltage potential applied across the switch and, more particularly, whether the current through the switch exceeds its threshold current or voltage, which then triggers the device into an on state. The current versus voltage characteristics of an ovonic threshold switch are shown in FIG. 2. The off state (from 0 to 1 in FIG. 2) may be substantially electrically non-conductive and the on state (from 2 to 3 in FIG. 2) may be a substantially conductive state with less resistance than the off state.

In the on state, the voltage across the switch, in one embodiment, is equal to its holding voltage $V_{hold}+IR_{on}$, where $R_{on}$ is the dynamic resistance from the extrapolated X axis intercept $V_{hold}$. For example, an ovonic threshold switch may have a threshold voltage $V_{th}$ and, if a voltage potential less than the threshold voltage of the switch is applied across the switch, then the switch may remain off or in a relatively high resistant state so that little or no electrical current passes.

Alternatively, if a voltage potential greater than the threshold voltage of the select device is applied across the device, then the device may turn on, i.e., operate in a relatively low resistance state so that significant electrical current passes through the switch. See the region from 2 to 3 in FIG. 2. In other words, one or more series connected switches may be in a substantially electrically non-conductive state at less than a predetermined voltage, e.g., the threshold voltage as applied across a switch. The switch may be in a substantially conductive state if greater than a predetermined voltage is applied across the switch.

In one embodiment, each switch may comprise a switch material that is a chalcogenide alloy. The switch material may be a material in a substantial amorphous state positioned between two electrodes that may be repeatedly and reversibly switched between a higher resistance off state that is greater than about 10 megaOhms and a relatively lower resistance on state that is about 1000 Ohms in series with the holding voltage by the application of electrical current or potential.

Each switch is a two-terminal device that has an IV curve similar to that of a phase change memory element that is in an amorphous state. However, unlike a phase change memory element, the ovonic threshold switch does not change phase. That is, the switching material of the ovonic threshold switch is not a programmable material and, as a result, the switch may not be a memory device capable of storing information. For example, the switching material may remain permanently amorphous and the IV characteristics may remain the same throughout the operating life.

In the low voltage, a low electric field mode, where the voltage applied across the switch is less than the threshold voltage $V_{th}$, the switch may be off or non-conducting and exhibits a relatively high resistance (greater than about 10 megaOhms). The switch may remain in the off state until its sufficient voltage, namely, the threshold voltage, is applied or a sufficient current is applied, namely, the threshold current, that switches the device to a conductive relatively low resistance on state. After a voltage potential of greater than about the threshold voltage is applied across the device, the voltage potential across the device may drop or snapback (see the region from 1 to 2 in FIG. 2) to a holding voltage $V_{hold}$, as indicated by the dashed lines between 2 and 4 in FIG. 2. Snapback may refer to the voltage difference between the threshold voltage and the holding voltage of the switch.

In the on state, the voltage potential across the switch may remain close to the holding voltage as current passing through the switch is increased. The switch may remain on until the current through the switch drops below a holding current. Below this value, the switch may turn off and return to a relatively high resistance, non-conductive off state, until the threshold voltage and current are again exceeded.

In some embodiments, only one switch may be used. In other embodiments, two or more series connected switches may be used.

Referring again to FIG. 1, if a negative input voltage from the pad 12 falls below $V_{CCX}$ by more than a threshold voltage of the ovonic threshold switch 14, the switch 14 turns on and shunts current from the pad 12 to $V_{CCX}$. Similarly, if a positive input voltage exceeds the $V_{SS}$ ground by more than the threshold voltage of the switch 18, the switch 18 turns on and shunts current from $V_{SS}$ to the pad 12. The ovonic switches 16 and 20 operate in the same way.

The resistor 22 ensures that the actual gate voltage on the input buffer 24 is lower in magnitude than the voltage on the pad 12 since the current shunted by the switches 16 and 20 will result in a voltage drop across the resistor 22. In one embodiment, the resistor 22 may be 150 Ohms.

The typical voltage for the holding voltage of the ovonic threshold switches is about 1.5 volts and a threshold voltage may range between 2 and 4 volts, depending on the thickness of the chalcogenide material used to form the ovonic threshold switch.

It should be noted that the IV curve for the ovonic threshold switch is symmetric, meaning that the same IV curve holds under negative bias with the direction of current flow reversed.

As long as the voltage across the ovonic threshold switch is less than the threshold voltage, the device remains inactive. During an electrostatic discharge event, the net voltage across the ovonic threshold switch exceeds the threshold voltage and the ovonic threshold switch becomes conductive. This occurs whenever the input voltage is greater than the threshold voltage of the ovonic threshold switch for a positive event or, when the input voltage is less than the supply voltage $V_{CCX}$, minus the threshold voltage, for a negative event.

After the electrostatic discharge event, the voltage across the switch drops below the holding voltage and the switch reverts to the inactive state. Thus, the input voltage must settle back so that the holding voltage is greater than the input voltage and the input voltage is greater than $V_{CCX}$ minus the holding voltage.

The values of the threshold voltage and the holding voltage are greater than the expected $V_{CCX}$ values. The switch does not threshold under normal operation, meaning that the voltage $V_{CCX}$ is greater than the input voltage and the input voltage is greater than $V_{SS}$ or ground. The switch transitions to a low conductance off state after an electrostatic discharge event. The threshold voltage is controlled or set by the thickness of the ovonic threshold switch chalcogenide film and the holding voltage is engineered through interface properties. Threshold devices can be connected in series to achieve integer multiples of the threshold voltage and holding voltage of a single ovonic threshold switch.

In some embodiments, the ovonic threshold switch may be formed in a structure over a conventional integrated circuit. Thus, substantial savings may be obtained since other transistors required to interface with the pad can utilize the space that would otherwise be consumed by electrostatic discharge protection diodes. Moreover, the ovonic threshold switch devices conduct higher current densities of greater than 10 $MA/cm^2$ than silicon diodes. This further reduces the overall area used for electrostatic discharge protection. In addition, the holding voltage and the threshold voltage are tunable by process control parameters, such as film thickness, whereas silicon diodes turn on voltage is basically a material constant.

An ovonic threshold switch 60, representing one of the switches 14, 16, 18, or 20, may be positioned over a semiconductor substrate 66. The substrate 66 may include other electronic components. As an example, a flash memory could be formed in the substrate 66 and the ovonic threshold switch 60 may be formed thereover. The switch 60 uses an address line 64 which may be a row line, in one embodiment, and may be formed within the substrate 66, for example, by damascene processes.

A stack including a pair of opposed electrodes 68 and 72 and an intermediate chalcogenide material 70 may form the bulk of the ovonic threshold switch. The edges of the stack may be aligned and may be formed by a common etching process that etches blanket deposited layers.

Over the stack may be a column electrode 62 which may extend transversely to the row electrode 64 in some embodiments. A dielectric material 74 may be provided around the stack.

Figure 3:
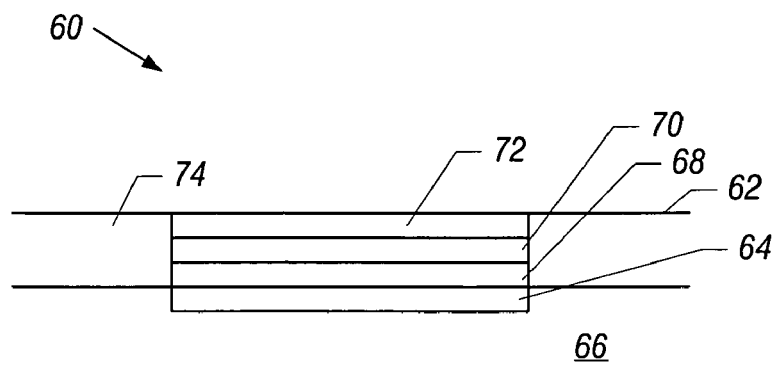
FIG. 3 is an enlarged, cross-sectional view of an ovonic threshold switch in one embodiment.
Figure 4:
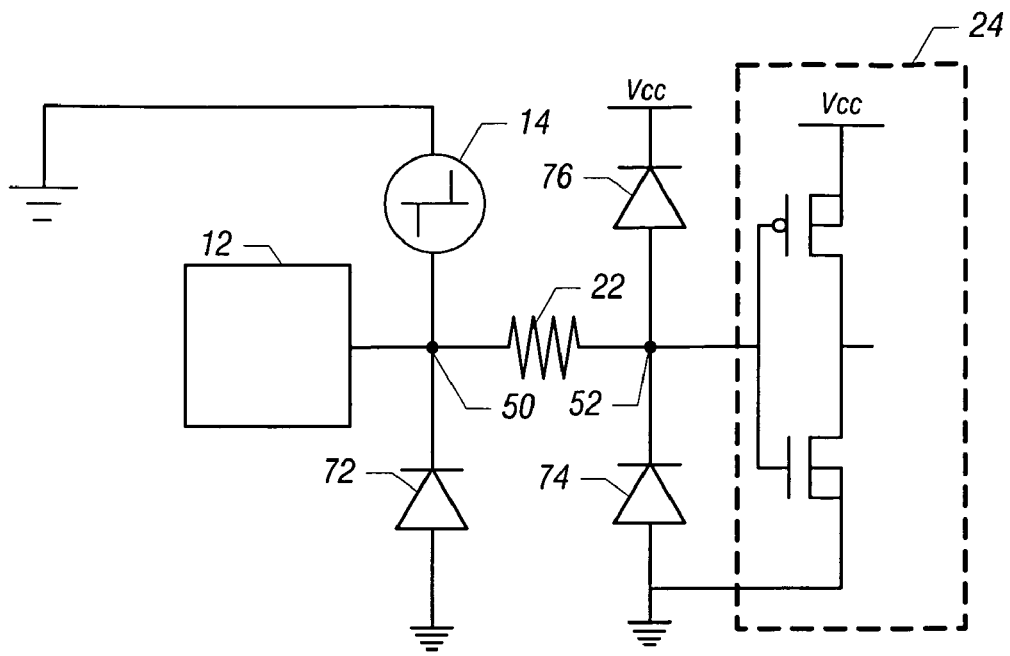
FIG. 4 is a depiction of a hybrid ovonic threshold switch and diode embodiment of the present invention.

Referring to FIG. 4, a hybrid approach may use ovonic threshold switch electrostatic discharge protection devices in combination with diodes. The grounded ovonic threshold switch 14 handles positive electrostatic discharge events and the diode 72 handles negative electrostatic discharge events. This implementation may have an area benefit since the diode 72 can reside within the silicon substrate 66 (FIG. 3 at 64) and the ovonic threshold switch 14 can be physically placed above the diode 72 over the substrate 66, thus, sharing the same area consumed by the diode 72.

In the embodiment shown in FIG. 4, diodes 76 and 74 are used in place of ovonic threshold switches 16 and 20 of FIG. 1. But the same arrangement may be used wherein the diode 76 is replaced by the ovonic threshold switch 16, in one embodiment, and the ovonic threshold switch 16 is formed directly overlying the substrate 66 where the diode 74 is formed (e.g. at 64 in FIG. 3). Clearly, any combination of diodes and ovonic threshold switches may be used in other embodiments.

Figure 5:
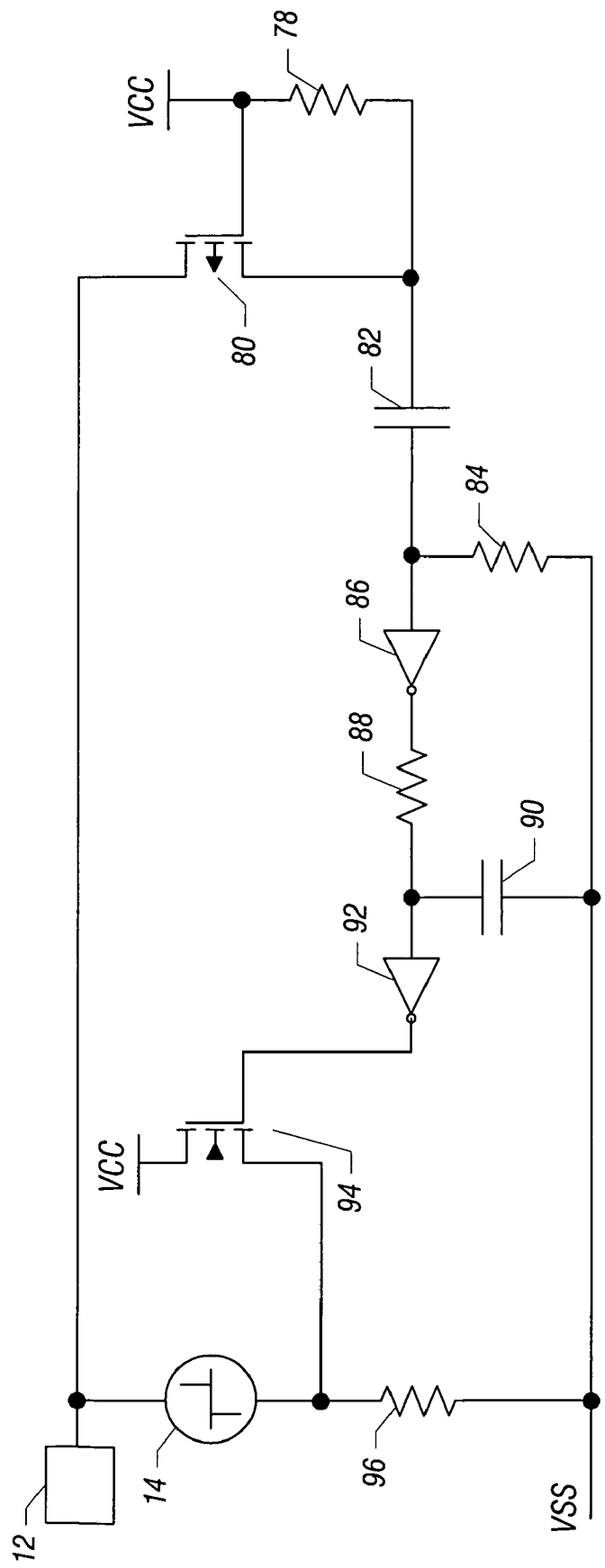
FIG. 5 is a circuit schematic of a timer circuit to revert an ovonic threshold switch into an inactive state in accordance with one embodiment of the present invention.

Referring to FIG. 5, in order to handle an electrostatic discharge event that occurs while power ($V_{CC}$) is being applied, extra timing circuitry may be used to revert the ovonic threshold switch (OTS) 14, with its holding voltage less than the supply voltage ($V_{CC}$), to an inactive state. The inactive state involves a voltage less than the holding voltage. The circuit, shown in FIG. 5, may handle positive ESD events. To handle a negative ESD event, a diode may be used, as indicated at 72 in FIG. 4, in addition to the circuit shown in FIG. 5.

The problem that arises is that when power is applied to the chip and an electrostatic discharge event occurs, the ovonic threshold switch 14 will not automatically revert to the less conductive state corresponding to the holding voltage or voltage below the holding voltage after handling the electrostatic discharge event. Instead, it will stay in the snapback condition (in the region between points 2 and 3 in FIG. 2).

The circuit in FIG. 5 causes the OTS to return to the less conductive or extinguished state after a time delay, such as one microsecond, sufficient to handle the electrostatic discharge event. The time delay is set by the resistor 88 and the capacitor 90.

A PMOS transistor 80 may be exposed instantaneously to the electrostatic discharge event. Ideally, the threshold voltage of the ovonic threshold switch 14 may be at a level sufficiently low as to preclude damaging the PMOS transistor 80 during an electrostatic discharge event. In other words, the PMOS transistor 80 does not see a voltage higher than the threshold voltage of the OTS 14.

The PMOS transistor 80 has the supply voltage on its gate. When the pad 12 experiences a positive electrostatic discharge spike, the transistor 80 is turned on. The transistor 80 drives its drain to the level on the pad 12.

Prior to an electrostatic discharge event, the capacitor 82 has the supply voltage on its right side and the resistor 84 pulls the left side of the capacitor 82 towards ground. The inverter 86 has its input grounded and its output is high. The inverter 92 has its output at ground. Therefore, the NMOS transistor 94 is off.

In response to an electrostatic discharge event, the transistor 80 turns on and its drain follows the level of the electrostatic discharge event voltage. No current flows through the capacitor 82, but the voltage on the capacitor's right side goes up, for example to about three times the supply voltage. Some of the increased voltage on the right side of the capacitor 82 is coupled to the left side of the capacitor 82. So, the input to the inverter 86 is high and its output is low. This low voltage is eventually communicated to the inverter 92 after a time delay determined by the values of the resistor 88 and the capacitor 90. This time delay allows sufficient time for the electrostatic discharge event to go away before the OTS 14 is extinguished.

After the time delay, the output of the inverter 92 goes from low to high, turning on the NMOS transistor 94. The NMOS transistor 94 dumps current into the resistor 96, which divides the voltage on the pad 12 between the ovonic threshold switch 14 and the resistor 96. This reduces the voltage across the ovonic threshold switch 14 to a level below the holding voltage, extinguishing the ovonic threshold switch 14.

The p-type transistor 80 prevents normal input swings within the range of $V_{SS}$ to $V_{CC}$ from causing spurious pulses into capacitor 82. The transistor 80 may be replaced by a diode as well. The inverters 92 and 86 are powered by $V_{CC}$. The n-type transistor 94 may be replaced by a PMOS device to make it more efficient at pumping current from the supply voltage. The caveat is, however, that when power is off and $V_{CC}$ equals zero, it would shunt some of the electrostatic discharge current onto the $V_{CC}$ grid.

When the gate of the transistor 94 goes high after this delay, the transistor 94 pumps current into the resistor 96 from the supply voltage. The transistor 94 needs to pump enough current such that the voltage of the resistor 96 is equal to the current through the ovonic threshold switch 14, plus the current through the transistor 94, that quantity times the resistance of the resistor 96, becomes greater than the supply voltage minus the holding voltage. This means, after rearranging terms, that the current through the transistor 94 must be greater than $V_{CC}-V_{hold}/R96-I_{OTS}$. Since the ovonic threshold switch 14 falls out of the conductive state at the holding voltage and the holding current, the current through the ovonic threshold switch is equal to $I_{hold}$ in the previous equation.

The circuit of FIG. 5 can serve as a power supply clamp if the pad 12 is replaced with $V_{CC}$ and the gate of the transceiver is tied to its drain, removing the need for resistor 78.

Figure 6:
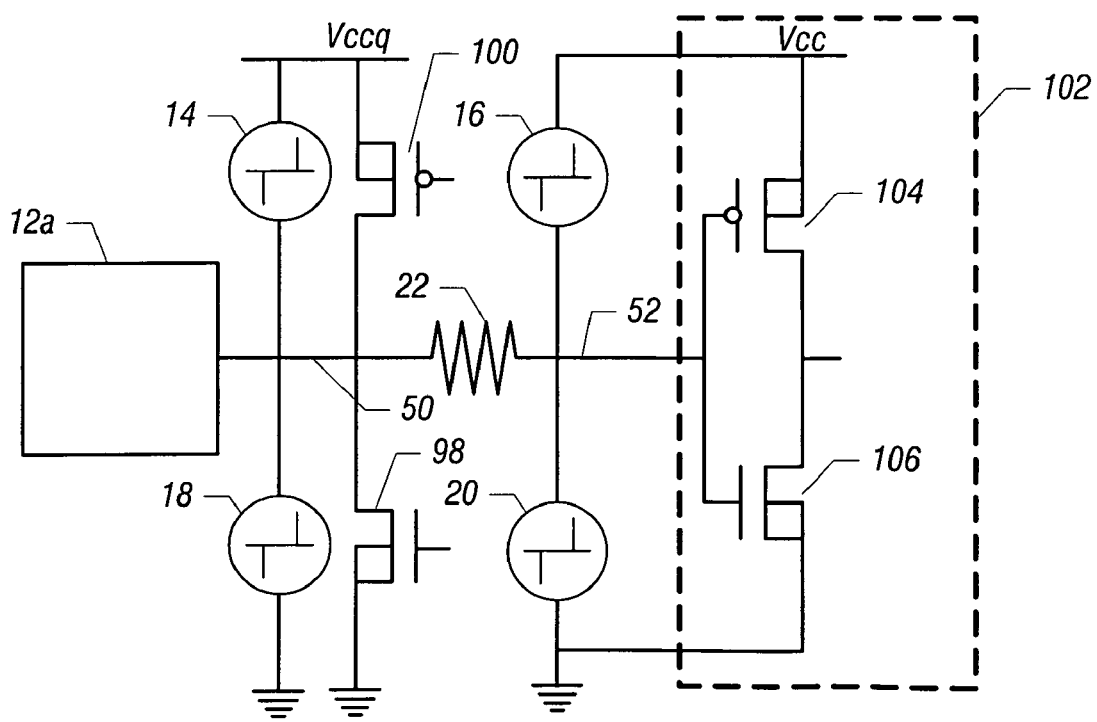
FIG. 6 is a circuit schematic for an embodiment using an output buffer instead of an input buffer.

Ovonic threshold switches can also be used for protection of input/output buffers, as indicated in FIG. 6. In FIG. 6, the input buffer 102 includes transistors 104 and 106. The transistors 100 and 98 form the output driver. The output buffers are generally similar to the input buffers except that the ovonic threshold switches or diodes are embedded into output driver transistors 104 and 106.

In some embodiments, the ovonic threshold switches 14 and 18 may be replaced by diodes which are the drain/body junction of the transistors 98 and 100. However, any of the ovonic threshold switches 14, 16, 18, or 20 could be implemented by diodes in some embodiments. The pad 12 may be a DQ pad in an output buffer embodiment.

Figure 7:
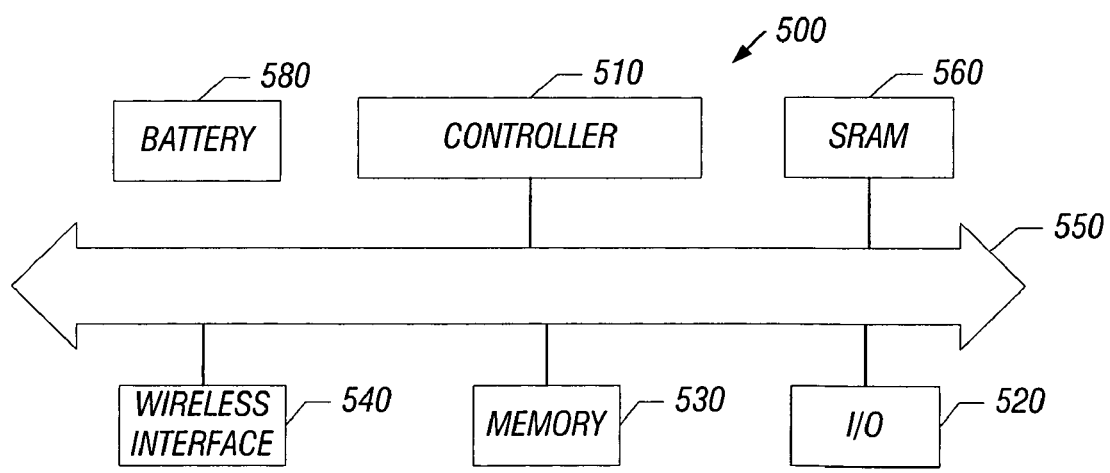
FIG. 7 is a system depiction for one embodiment of the present invention.

Turning to FIG. 7, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

Any of the integrated circuits of the system 500 may include integrated electrostatic discharge circuits as disclosed herein. The electrostatic discharge circuits may be associated with various pads.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   coupling an electrostatic discharge protection circuit between a pad and a protected circuit;
   providing first and second switches coupled to a supply voltage and third and fourth switches coupled to ground, each of said switches coupled to a common line that extends from said pad to said protected circuit, at least one of said switches being an ovonic threshold switch; and
   making the holding voltage of the ovonic threshold switches greater than the input voltage during an electrostatic discharge event.

2. The method of claim 1 including providing a resistance in said line between the first and second ovonic threshold switches.

3. The method of claim 1 including providing a resistor in series with each of said switches.

4. The method of claim 1 including making the threshold voltage and holding voltage of the ovonic threshold switch greater than the supply voltage of the protected circuit.

5. The method of claim 1 including forming said electrostatic discharge protection circuit over a substrate having a different circuit formed in said substrate.

6. The method of claim 1 including using switches having a threshold voltage less than the voltage from the pad during a positive electrostatic discharge event.

7. The method of claim 1 including using switches whose holding voltage is greater than the supply voltage of the protected circuit.

8. The method of claim 1 including forming at least one of said switches from a diode.

9. The method of claim 8 including forming said diode in a substrate and forming said ovonic threshold switch directly over said diode.

10. An apparatus comprising:
    a protected circuit;
    a pad; and
    an electrostatic discharge protection circuit coupled between said pad and said protected circuit, said protection circuit including first and second switches coupled to a supply voltage and third and fourth switches coupled to ground, each of said switches coupled to a common line that extends from said pad to said protected circuit, at least one of said switches being an ovonic threshold switch, wherein the holding voltage of said ovonic threshold switch is greater than the input voltage during an electrostatic discharge event.

11. The apparatus of claim 10 including a resistor in said line between the first and second ovonic threshold switches.

12. The apparatus of claim 10 including a resistor in series with each of said switches.

13. The apparatus of claim 11 wherein the threshold voltage and holding voltage of the ovonic threshold switch is greater than the supply voltage of the protected circuit.

14. The apparatus of claim 10 including a substrate, said electrostatic discharge protection circuit formed over said substrate and a different circuit being formed in said substrate.

15. The apparatus of claim 10 wherein said switches have a threshold voltage less than the voltage from the pad during a positive electrostatic discharge event.

16. The apparatus of claim 10 wherein the holding voltage of said ovonic threshold switch is greater than the supply voltage of the protected circuit.

17. The apparatus of claim 10 wherein said pad is a low voltage input pad.

18. The apparatus of claim 11 wherein said protected circuit is complementary metal oxide semiconductor circuit.

19. The apparatus of claim 10 wherein at least one of said switches is a diode.

20. The apparatus of claim 19 wherein said diode is formed in a substrate and said ovonic threshold switch is formed directly over said diode.

21. A protection circuit comprising:
    an ovonic threshold switch; and
    a circuit coupled to said ovonic threshold switch to extinguish said ovonic threshold switch after a time delay, a pair of inverters coupled to a transistor and an RC circuit between said inverters, one of said inverters to drive a transistor, said transistor to control the voltage on a resistor coupled to said ovonic threshold switch so as to transfer voltage across an ovonic threshold switch to said resistor and to reduce the voltage across said ovonic threshold switch to a level at or below the holding voltage of said ovonic threshold switch.

22. The circuit of claim 21 including a diode to handle negative electrostatic discharge events, said ovonic threshold switch to handle positive electrostatic discharge events.

23. The circuit of claim 21 wherein said time delay is approximately a microsecond.

* * * * *